United States Patent
Chen

[11] Patent Number: 6,156,608
[45] Date of Patent: Dec. 5, 2000

[54] METHOD OF MANUFACTURING CYLINDRICAL SHAPED CAPACITOR

[75] Inventor: Terry Chen, Chung-Ho, Taiwan

[73] Assignee: United Silicon Incorporated, Hsinchu, Taiwan

[21] Appl. No.: 09/174,388

[22] Filed: Oct. 14, 1998

[30] Foreign Application Priority Data

Aug. 20, 1998 [TW] Taiwan .................................. 87113700

[51] Int. Cl.[7] ............................................. H01L 21/8242
[52] U.S. Cl. ........................................... 438/253; 438/396
[58] Field of Search .................................... 438/253, 396, 438/FOR 212, FOR 220

[56] References Cited

U.S. PATENT DOCUMENTS 5,744,833 4/1998 Chao .

*Primary Examiner*—George Fourson
*Assistant Examiner*—Barbara Elizabeth Abbott
*Attorney, Agent, or Firm*—J. C. Patents; Jiawei Huang

[57] ABSTRACT

A method of manufacturing a cylindrical shaped capacitor includes the steps of providing a substrate that already has a polysilicon plug and a word line formed thereon, and then forming an insulation layer and a first dielectric layer over the substrate. Thereafter, the first dielectric layer is patterned to form an opening. Then, a first conductive layer and a second dielectric layer are deposited in sequence over the first dielectric layer and the opening. Next, the first conductive layer and the second dielectric layer are etched back to form spacers on the sidewalls of the opening. Subsequently, etching is carried out down through the opening using the sidewall spacers as a mask until the polysilicon plug is exposed. After that, a second conductive layer is formed over entire substrate, and then the second conductive layer is etched back so that only a portion of the second conductive layer and the first conductive layer remain. The second and the first conductive layers together constitute the lower electrode of the capacitor. Finally, a dielectric thin film and a third conductive layer are formed in sequence over the lower electrode, thereby establishing a cylindrical shaped capacitor structure above the substrate.

8 Claims, 12 Drawing Sheets

METHOD OF MANUFACTURING CYLINDRICAL SHAPED CAPACITOR

CROSS-REFERENCE TO RELATED APPLICATION

This application claims the priority benefit of Taiwan application serial no. 87113700, filed Aug. 20, 1998, the full disclosure of which is incorporated herein by reference.

BACKGROUND OF THE INVENTION

1. Field of Invention

The present invention relates to a method of manufacturing dynamic random access memory (DRAM). More particularly, the present invention relates to a method of manufacturing a cylindrical-shaped DRAM capacitor that has a larger storage electrode area, and hence has a higher storage capacity.

2. Description of Related Art

As a microprocessor becomes more powerful, the amount of software programs the microprocessor can execute increases correspondingly. Consequently, memories having a high storage capacity are in great demand. FIG. 1 is a circuit diagram showing the memory unit of a DRAM. As shown in FIG. 1, a memory unit is composed of a transfer transistor 10 and a storage capacitor 11. The source terminal of the transfer transistor 10 is connected to a bit line 12. The gate terminal of the transfer transistor 10 is connected to a word line 13. The drain terminal of the transistor 10 is connected to a storage electrode 14, known also as the lower electrode, of a storage electrode 11. The plate electrode 15, known also as the upper electrode or cell plate, is connected to a fixed voltage source. Furthermore, a thin dielectric layer 16 is formed between the storage electrode 14 and the plate electrode 15.

A capacitor is a critical component in DRAM for data storage. If the amount of charges stored in a capacitor is great, the memory is less vulnerable to corruption by external noise signals, such as alpha particles, which particles result in soft errors when data is retrieved. In addition, frequency of refreshes necessary for bringing up the charges in the capacitor can be lowered considerably. There are a few ways to increase the charge storage capacity of a capacitor, including: (1) increasing the dielectric constant of the dielectric layer so that total amount of stored charges per unit surface area of the capacitor increases; (2) reducing the thickness of the dielectric layer—however, there is always a minimum thickness for a given material before quality and reliability deteriorates; and (3) increasing the surface area of the capacitor as much as possible so that total amount of stored charges can increase—however, increasing the surface area of an individual capacitor reduces the overall level of integration of a DRAM.

Conventionally, storage capacity of a DRAM capacitor is increased by a two-dimensional expansion of its storage electrode. This is the so-called planar type of capacitor. However, a planar type of capacitor normally occupies a large substrate area, and hence is unsuitable for fabricating highly integrated circuits. Consequently, three-dimensional types of capacitor such as the stacked type and the trench type have been developed. Even so, simple three-dimensional structures are incapable of providing adequate capacitance currently demanded by DRAMs. Therefore, methods of increasing the electrode area of a capacitor for a given area on a chip are still being sought.

FIGS. 2A through 2F are cross-sectional views showing the progression of manufacturing steps in producing a cylindrical-shaped DRAM capacitor according to a conventional method. First, as shown in FIG. 2A, a MOS device 200 is provided. The MOS device has source/drain regions 201, a field oxide layer 202 and a gate terminal 203. Thereafter, a thin first oxide layer 204 and a thin silicon nitride layer 205 are sequentially formed over the substrate 200. The silicon nitride layer 205 serves as a barrier layer in subsequent etching operation.

Next, as shown in FIG. 2B, photolithographic and etching operations are carried out to pattern the silicon nitride layer 205 and the first oxide layer 204 to form a first contact opening 206. The first contact opening 206 exposes one of the source/drain regions 201. Thereafter, a first polysilicon layer 207 is deposited over the silicon nitride layer 205 to fill the first contact opening 206 completely. Subsequently, the first polysilicon layer 207 is etched back until the first polysilicon layer 207 and the silicon nitride layer 205 are at the same height level as shown in FIG. 2C.

Next, as shown in FIG. 2D, a second oxide layer 208 is formed over the silicon nitride layer 205. For example, chemical vapor deposition is used to form a silicon dioxide layer. Thereafter, photolithographic and etching processes are used to pattern the silicon dioxide layer 208, thereby forming a second opening 209 that exposes the first opening 206. Subsequently, a second polysilicon layer 210 is formed over the surface of the second opening 209 and the second oxide layer 208 so that the second polysilicon layer 210 and the first polysilicon layer 207 are connected. Then, a third oxide layer 211 is formed over the second polysilicon layer 210.

Next, as shown in FIG. 2E, the third oxide layer 211 is etched back to expose the second polysilicon layer 210, and then the second polysilicon layer 210 is also etched back to expose the second oxide layer 208.

Finally, as shown in FIG. 2F, a wet etching method is used to remove the remaining portion of the third oxide layer 211 and the second oxide layer 208 using the silicon nitride layer 205 as an etching barrier layer. Lastly, a dielectric thin film 212 is formed over the second polysilicon layer 210, and then a third polysilicon layer 213 is formed over the dielectric thin film 212 to form a complete cylindrical shaped DRAM capacitor.

At present, conventional methods of increasing DRAM capacitance centers upon improving the surface profile by, for example, producing various undulating features. Although these methods are capable of increasing surface area and hence capacitance a little, the amount of increase is limited and so cannot meet the higher capacitance demanded, especially for miniaturized devices. Moreover, a large number of steps are required before the desired capacitor structure is formed.

In light of the foregoing, there is a need to provide an improved method of forming cylindrical shaped DRAM capacitor.

SUMMARY OF THE INVENTION

Accordingly, the present invention is to provide a method of manufacturing a cylindrical-shaped capacitor such that a larger electrode area is obtained. Furthermore, the method uses parallel spacers as an etching mask, so openings are formed by a self-aligning method. Therefore, photolithographic operation can be simplified and the degree of alignment between top and bottom layer becomes less critical.

To achieve these and other advantages and in accordance with the purpose of the invention, as embodied and broadly described herein, the invention provides a method of manufacturing a cylindrical-shaped capacitor. The method includes providing a substrate that already has a polysilicon plug, a word line and a bit line formed thereon, and then forming an insulation layer and a first dielectric layer over the substrate. Thereafter, the first dielectric layer is patterned to form an opening, and then a first conductive layer and a second dielectric layer are deposited in sequence over the first dielectric layer and the opening. Next, the first conductive layer and the second dielectric layer are etched back to form spacers on the sidewalls of the opening. Subsequently, etching is carried out down through the opening using the sidewall spacers as a mask until the polysilicon plug and the word line are exposed. After that, a second conductive layer is formed over entire substrate, and then the second conductive layer is etched back so that a portion of the second conductive layer and a portion of the first conductive layer remain. The second and the first conductive layers together constitute the lower electrode of the capacitor. Finally, a dielectric thin film and then a third conductive layer are formed above the lower electrode, thereby forming a cylindrical shaped capacitor structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
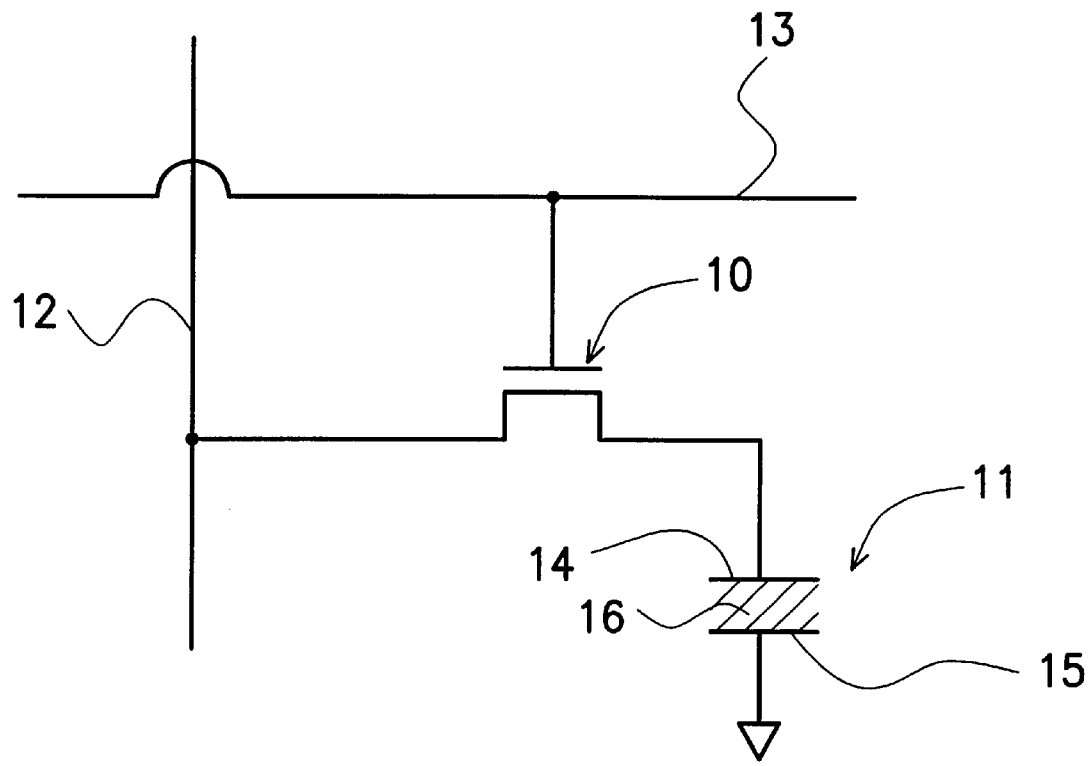
FIG. 1 is a circuit diagram showing the memory unit of a DRAM.
Figure 2A:
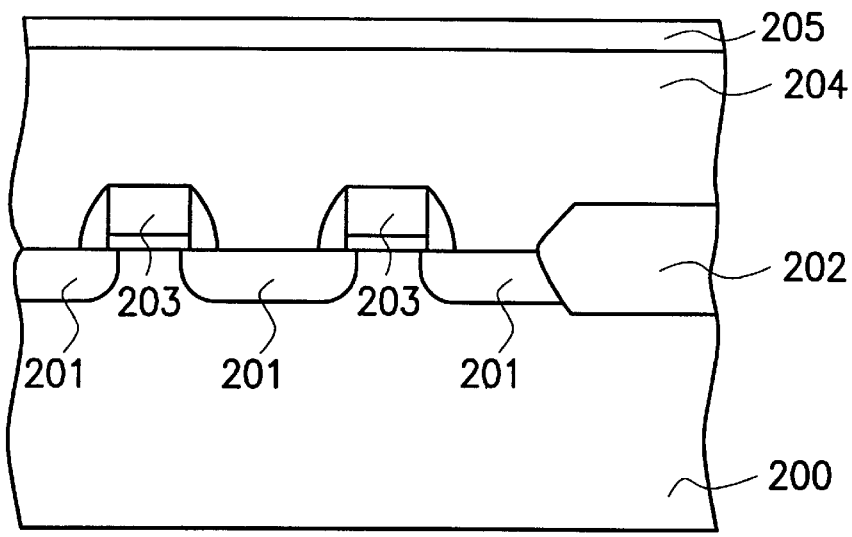
FIGS. 2A through 2F are cross-sectional views showing the progression of manufacturing steps in producing a cylindrical-shaped DRAM capacitor according to a conventional method.
Figure 2B:
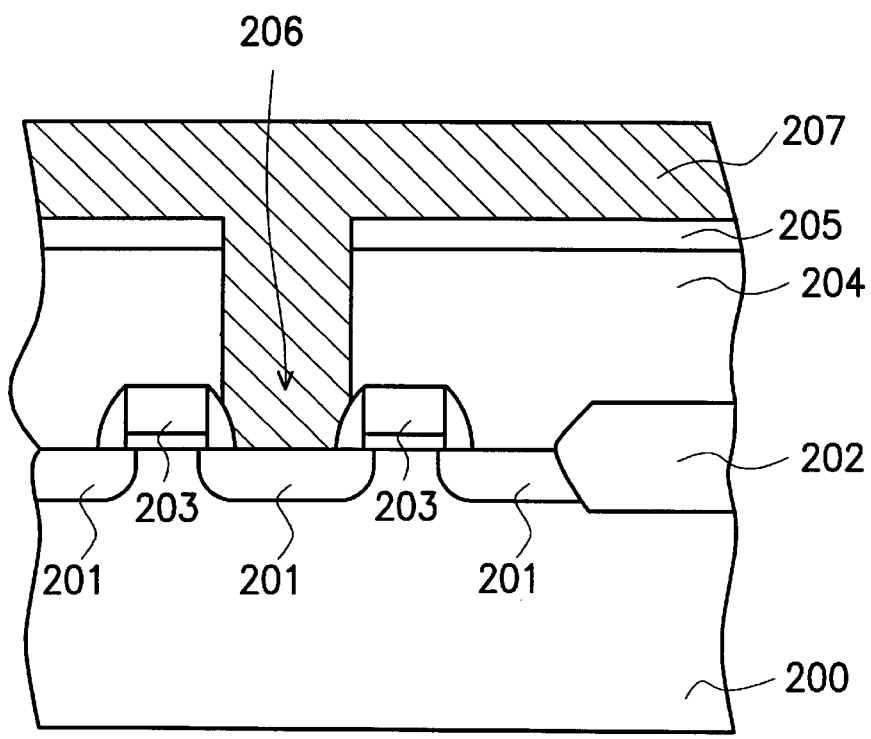
Figure 2C:
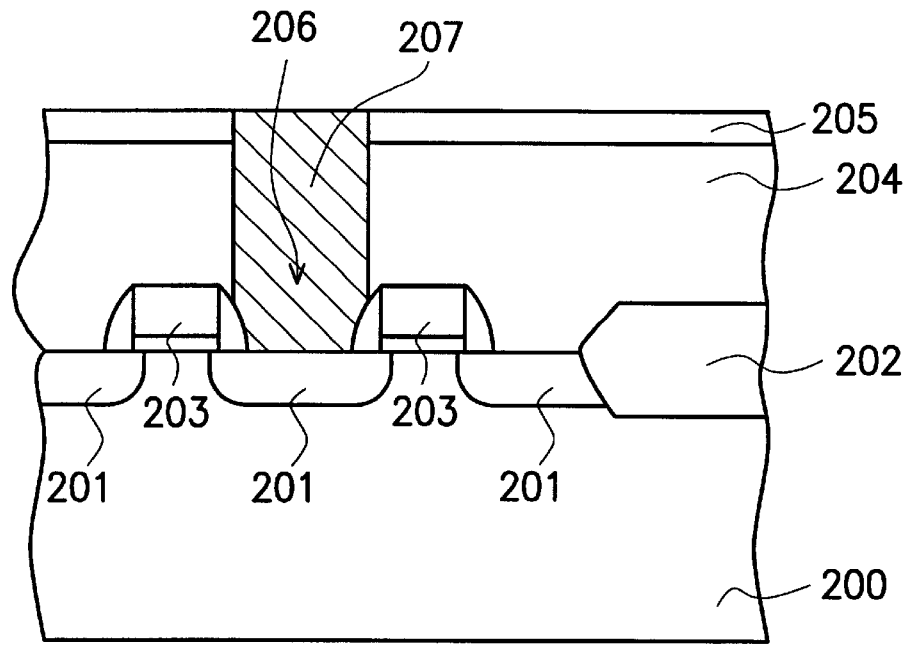
Figure 2D:
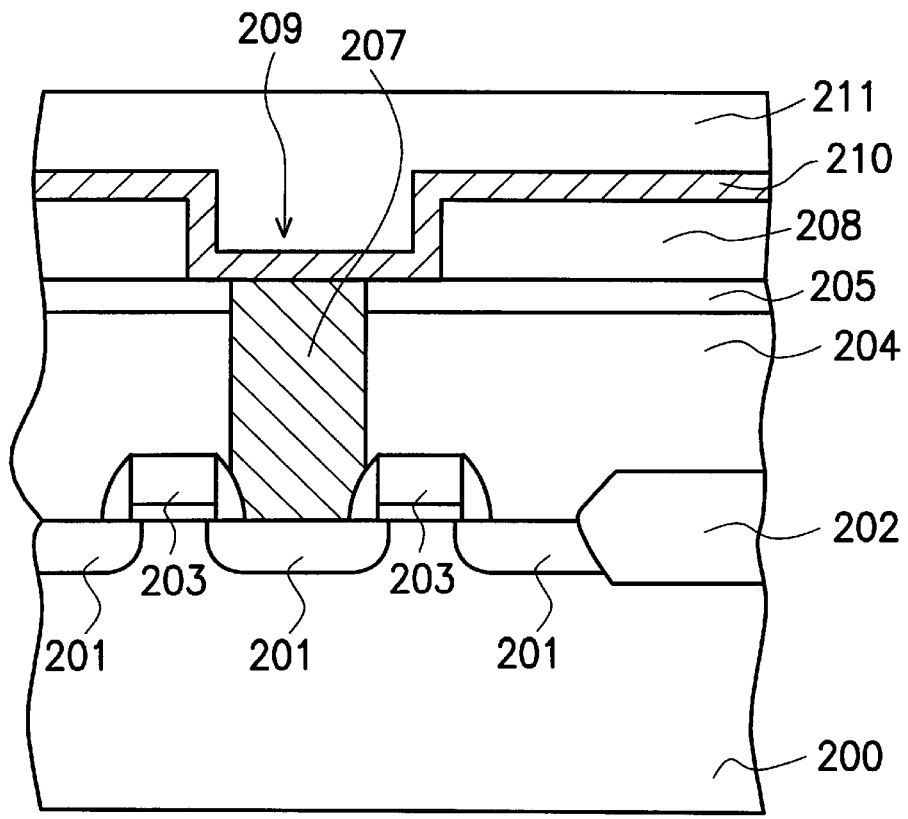
Figure 2E:
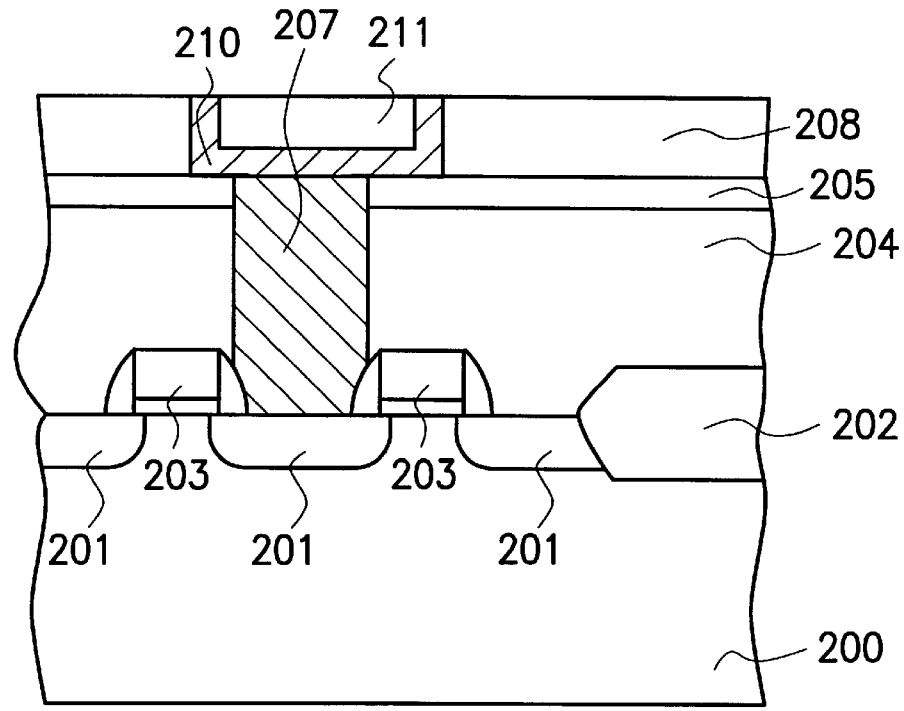
Figure 2F:
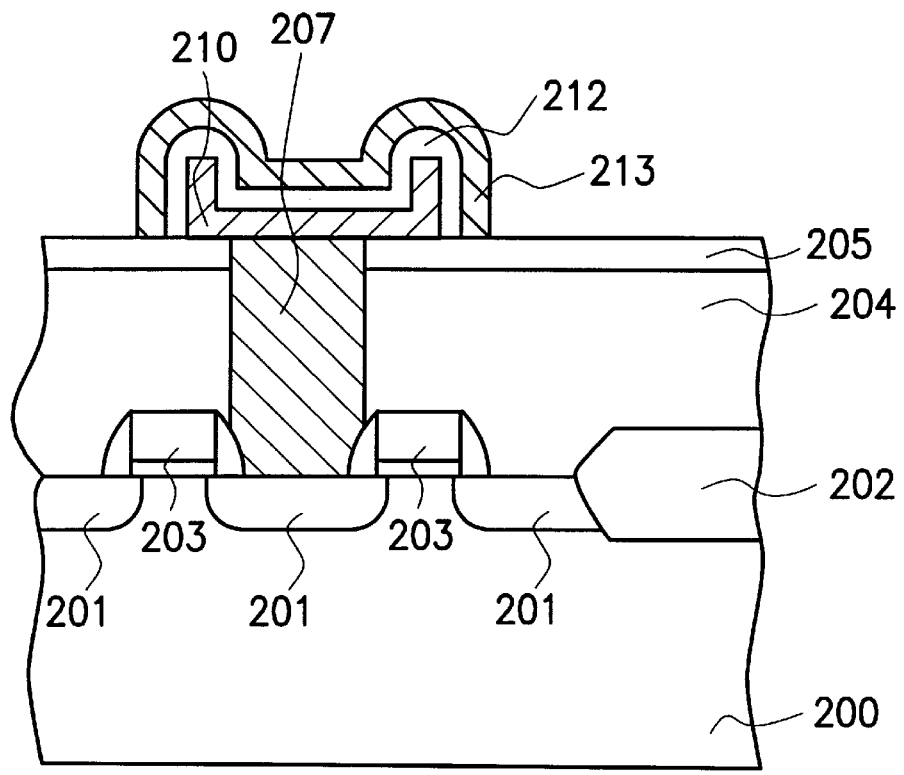

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3G are cross-sectional views showing the progression of manufacturing steps in producing a cylindrical-shaped DRAM capacitor according to the preferred embodiment of this invention. FIGS. 4A through 4G are the respective cross-sectional views in a direction perpendicular to the ones shown in FIGS. 3A through 3G.

Figure 3A:
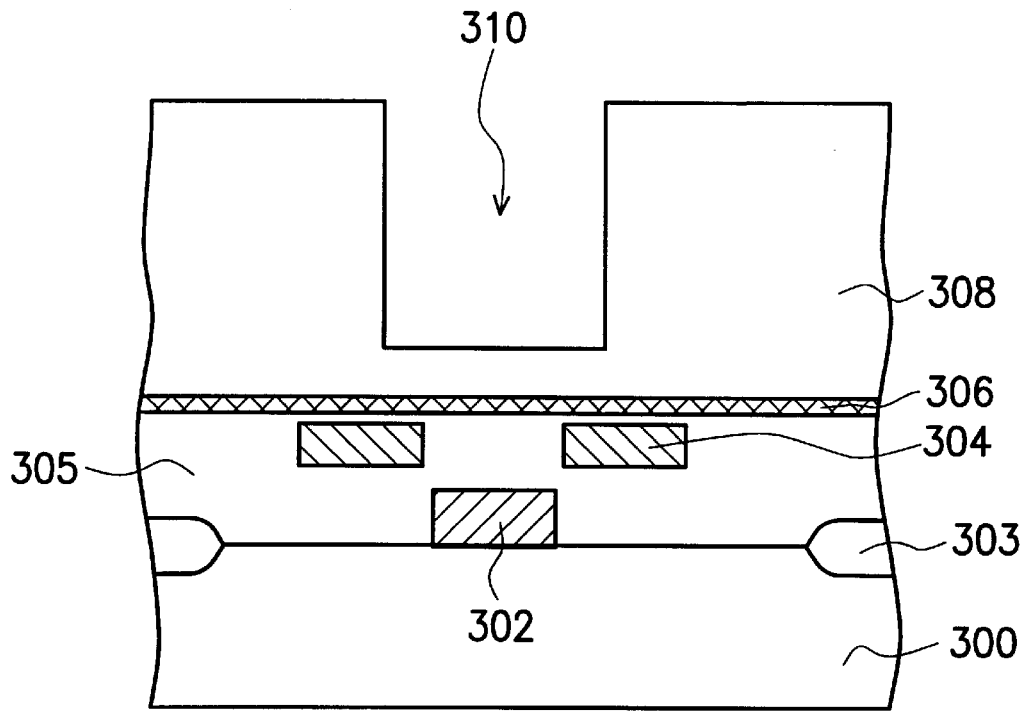
FIGS. 3A through 3G are cross-sectional views showing the progression of manufacturing steps in producing a cylindrical-shaped DRAM capacitor according to the preferred embodiment of this invention.
Figure 4A:
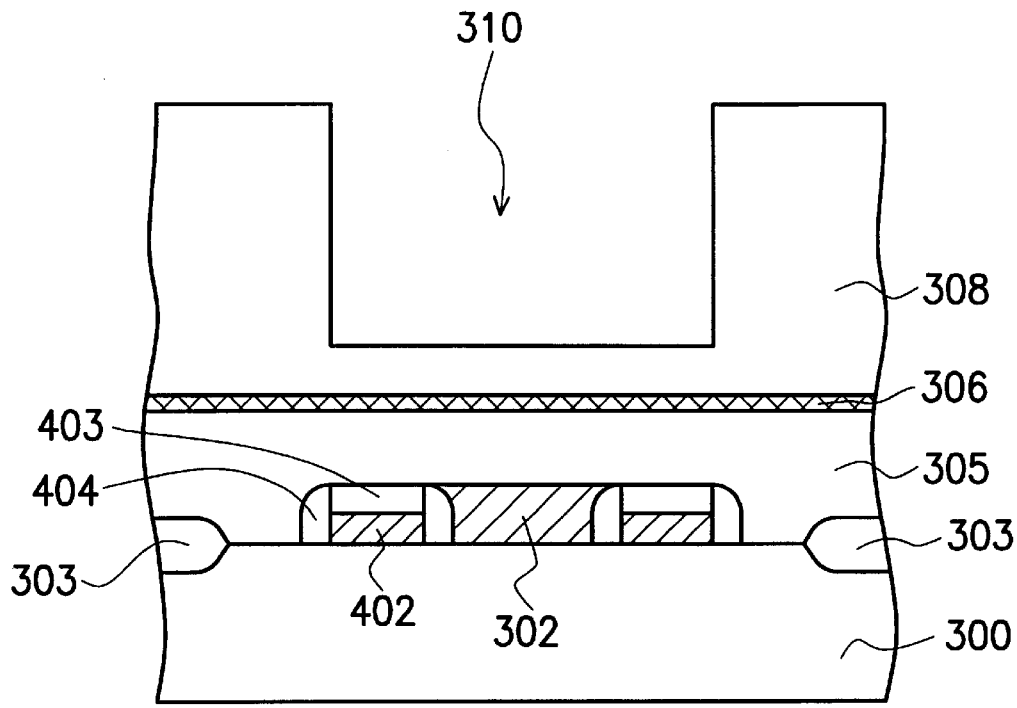
FIGS. 4A through 4G are cross-sectional views in a direction perpendicular to FIGS. 3A through 3G showing the progression of manufacturing steps in producing a cylindrical shaped DRAM capacitor according to the preferred embodiment of this invention.

First, as shown in FIGS. 3A and 4A, a substrate 300 having a number of layers on top is provided. The layers above the substrate 300 includes a polysilicon plug 302, a field oxide layer 303, a bit line 304, a word line 402 and a dielectric layer 305. In addition, the word line 402 is covered on top by a silicon nitride layer 403 and shielded on both sides by sidewall spacers 404. Both the silicon nitride layer 403 and the spacers 404 are used for protecting the word line 402. Since the above structures can be fabricated using conventional methods, detailed description is omitted here. Next, an insulation layer 306, for example, a silicon nitride or silicon oxy-nitride layer is deposited over the substrate structure. Thereafter, a first dielectric layer 308 is formed over the silicon nitride layer 306. The first dielectric layer 308 can be a silicon dioxide layer, for example. In the subsequent step, the first dielectric layer 308 is patterned to form an opening 310.

Figure 3B:
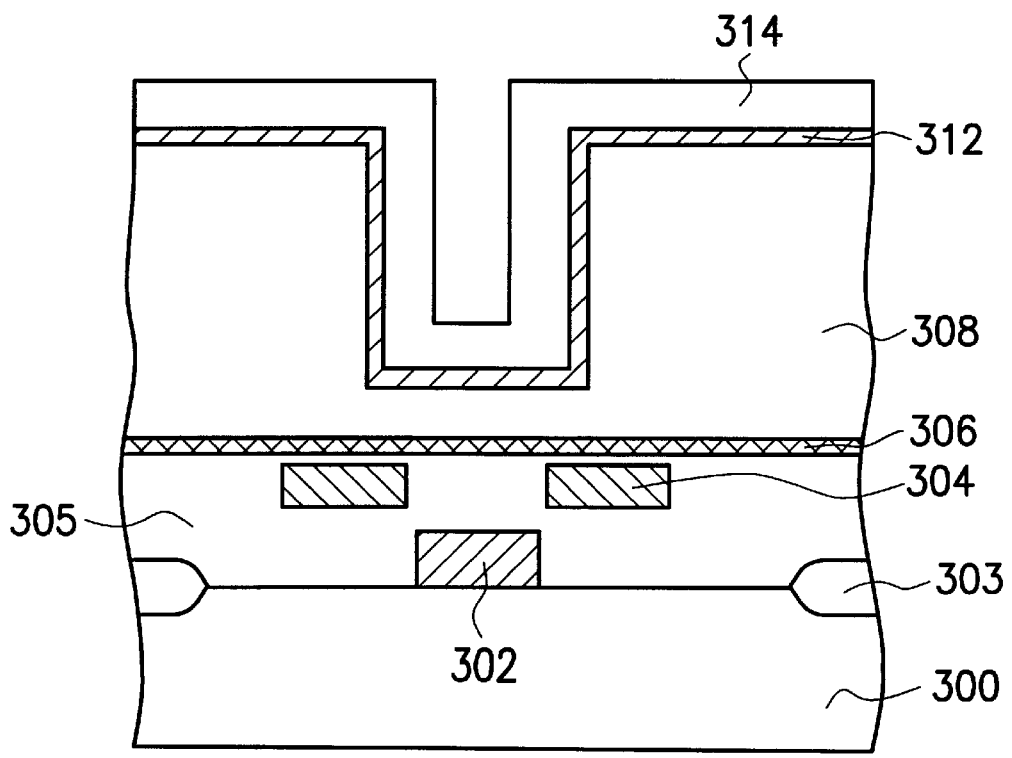
Figure 4B:
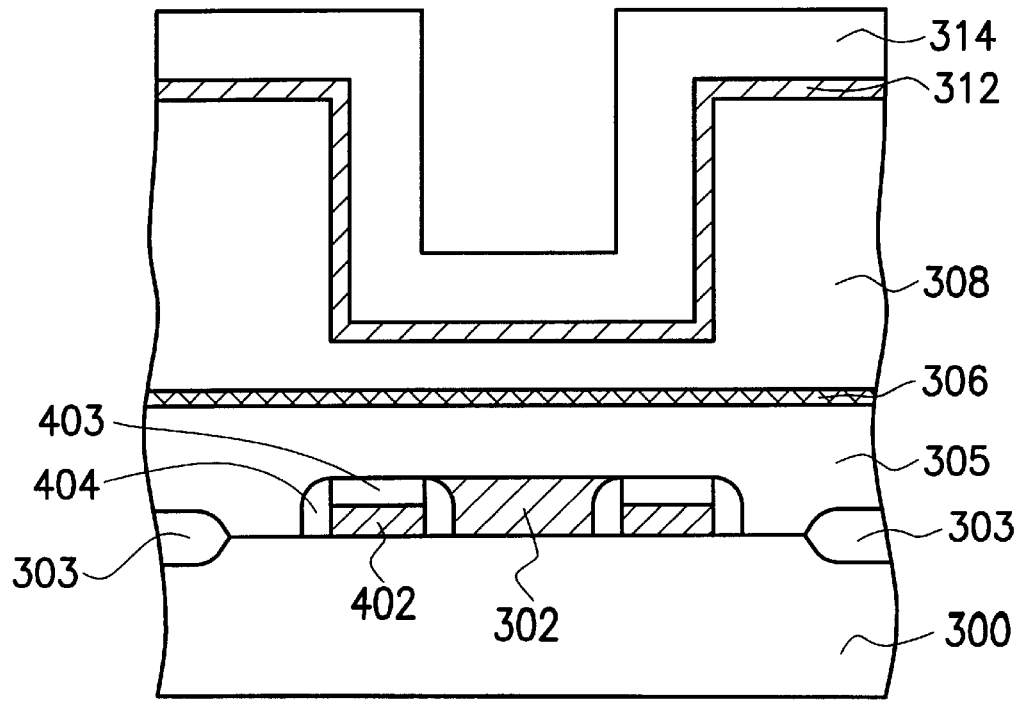

Next, as shown in FIGS. 3B and 4B, a first conductive layer 312 and a second dielectric layer 314 are sequentially formed over the first dielectric layer 308 and cover the interior of the opening 310. For example, the first conductive layer 312 can be a polysilicon layer while the second dielectric layer 314 can be a silicon dioxide layer.

Figure 3C:
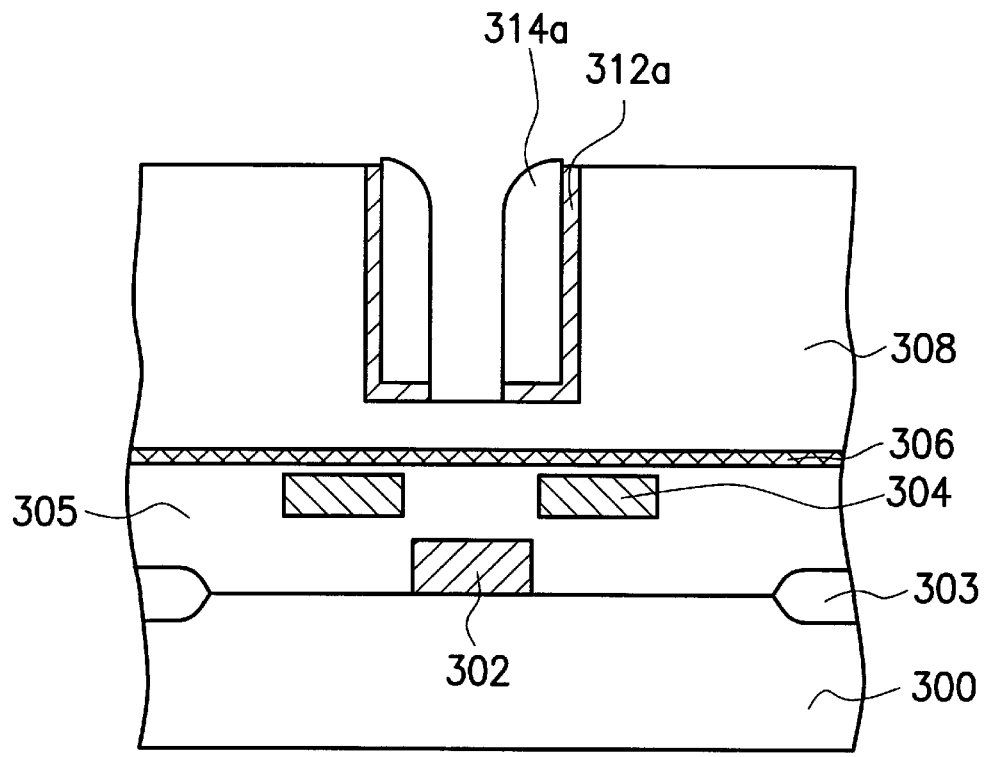
Figure 4C:
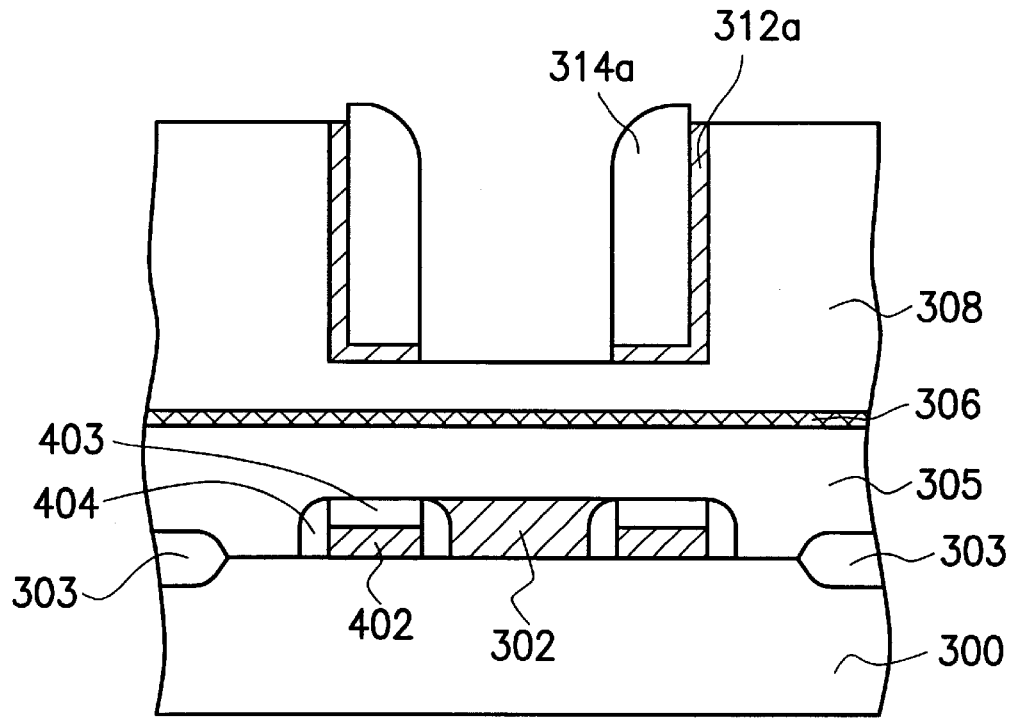

Thereafter, as shown in FIGS. 3C and 4C, a portion of the second dielectric layer 314 and the first conductive layer 312 is removed to expose the first dielectric layer 308. Hence, spacers 314a are formed on the sidewalls of the opening 310. The second dielectric layer 314 and the first conductive layer 312 can be removed using an etching back method. In the above etching back operation, the first conductive layer 312a sandwiched between the spacers 314a and the first dielectric layer 308 remains.

Figure 3D:
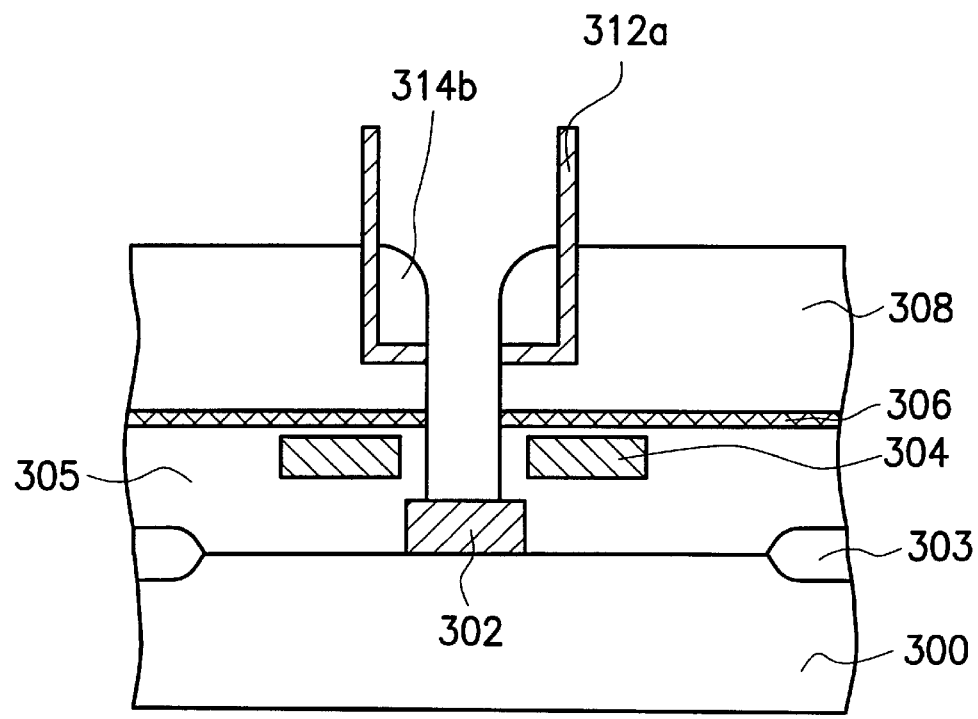
Figure 4D:
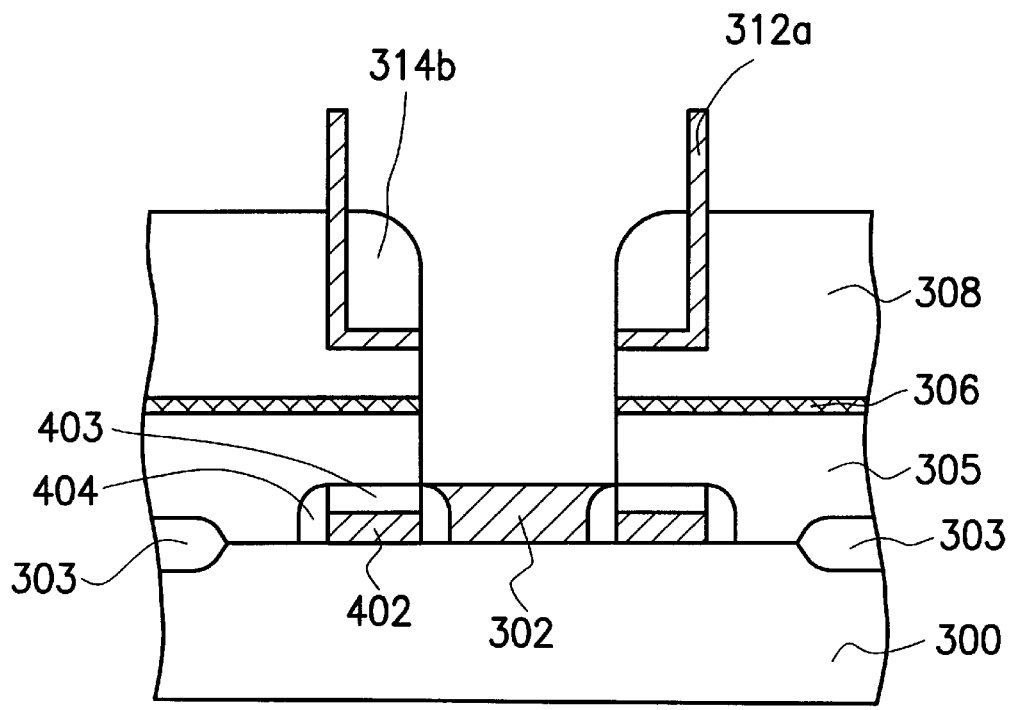

Next, as shown in FIGS. 3D and 4D, a portion of the exposed first dielectric layer 308, the insulation layer 306 below the first dielectric layer 308 and the substrate 300 are removed to expose the polysilicon plug 302 and the word line 402. The first dielectric layer 308, the insulation layer 306 and the substrate 300 can be removed using an etching method. During the etching operation, the spacers 314a act as a self-aligning mask so that the first dielectric layer 308, the insulation layer 306 and the substrate 300 are etched in sequence down through the opening. In addition, a portion of the first dielectric layer 308 and a portion of the second dielectric layer 314a outside the opening are etched away. After the etching operation, the upper surface of the first dielectric layer 308 and the second dielectric layer 314b remains at a level lower than the first conductive layer 312a. Hence, a portion of the first conductive layer 312a is exposed.

Figure 3E:
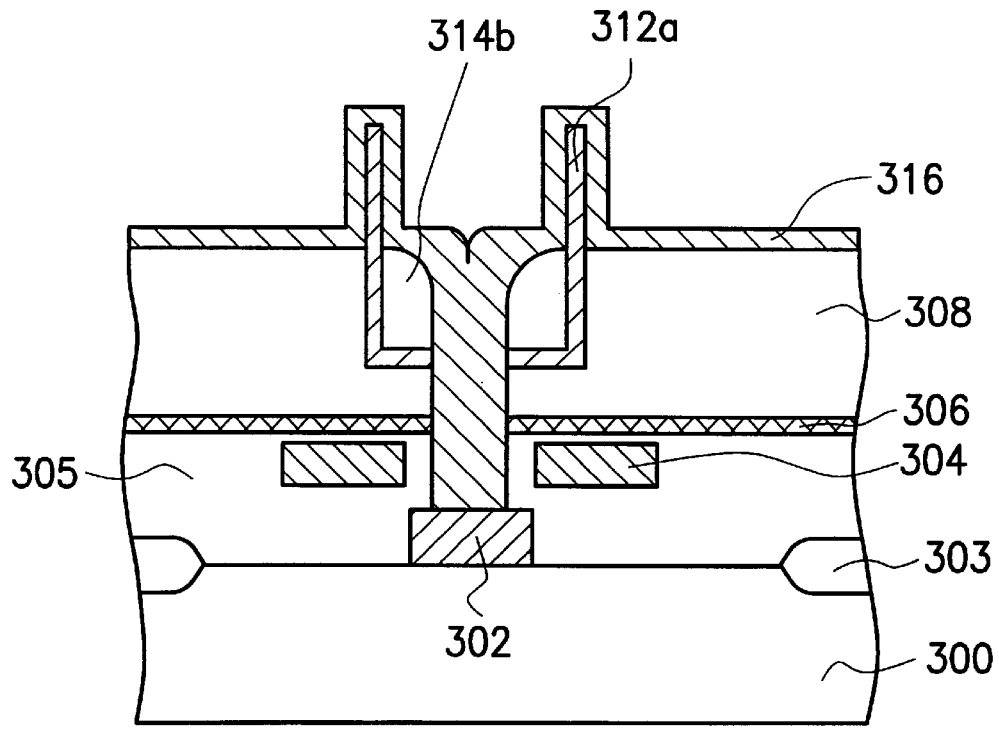
Figure 4E:
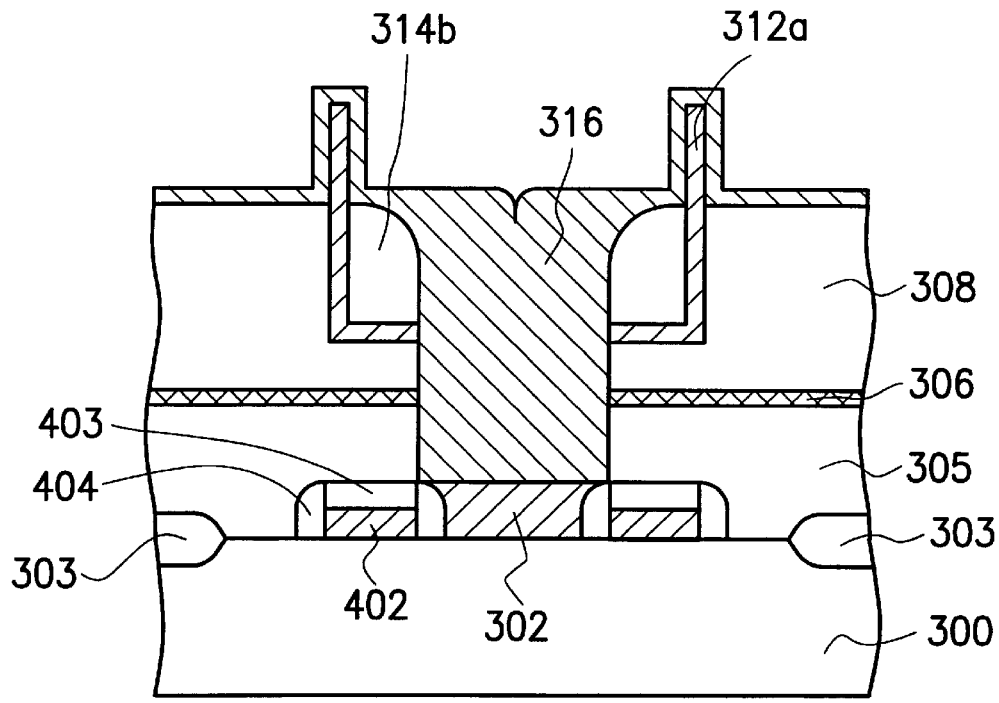

Thereafter, a second conductive layer 316 is deposited over the first dielectric layer 308 and the first conductive layer 312a as shown in FIGS. 3E and 4E. The second conductive layer 316 also fills the via hole that leads to the polysilicon plug 302 and word line 402. The conductive layer 316 can be a polysilicon layer.

Figure 3F:
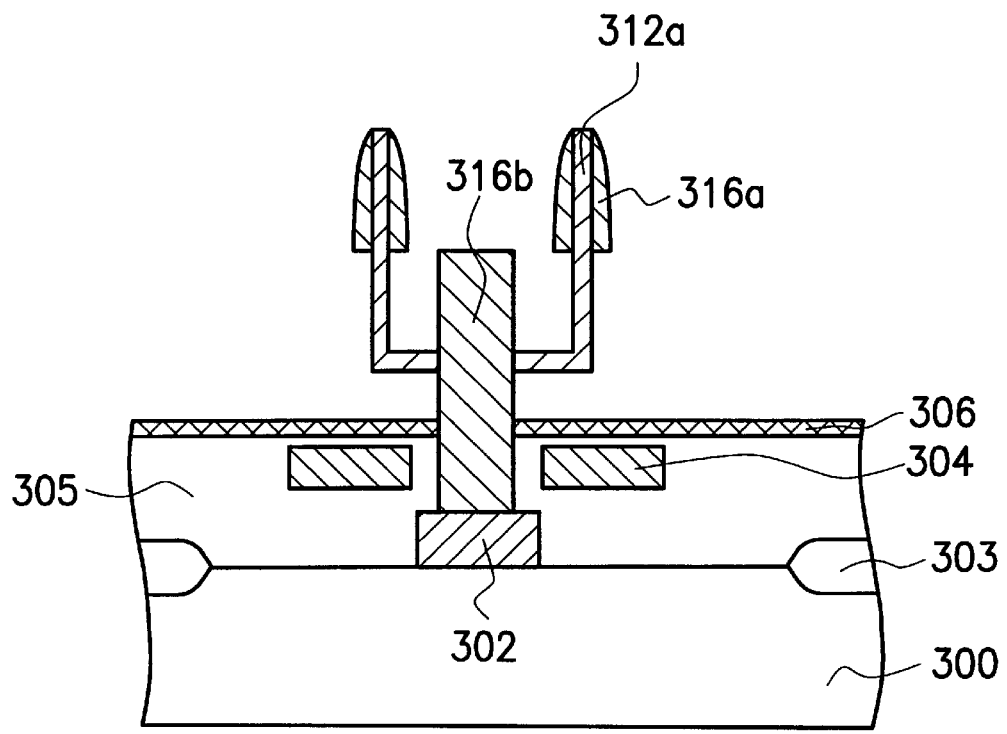
Figure 4F:
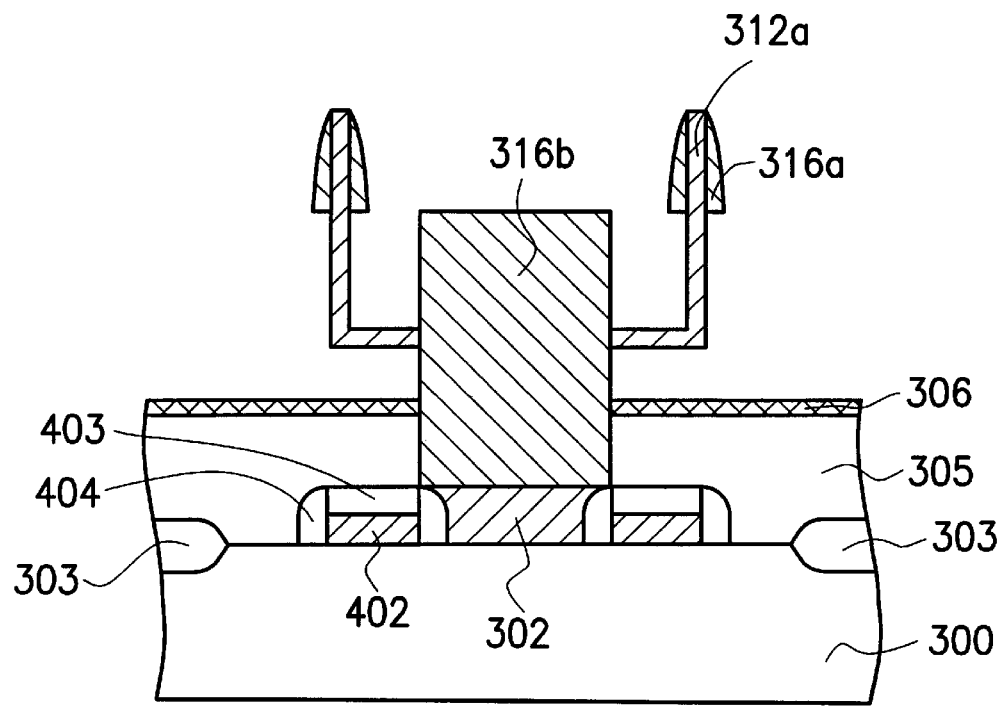

Next, as shown in FIGS. 3F and 4F, the second conductive layer 316 is etched back. The second conductive layer 316b inside the via hole and the second conductive layer 316a on the sidewalls of the first conductive layer 312a remains. The second conductive layer 316b and the first conductive layer 312a together form a lower electrode structure. After the second conductive layer 316 is etched, the residual first dielectric layer 308 and the second dielectric layer 314b are removed. The first dielectric layer 308 and the second dielectric layer 314b can be removed using a wet etching operation.

Figure 3G:
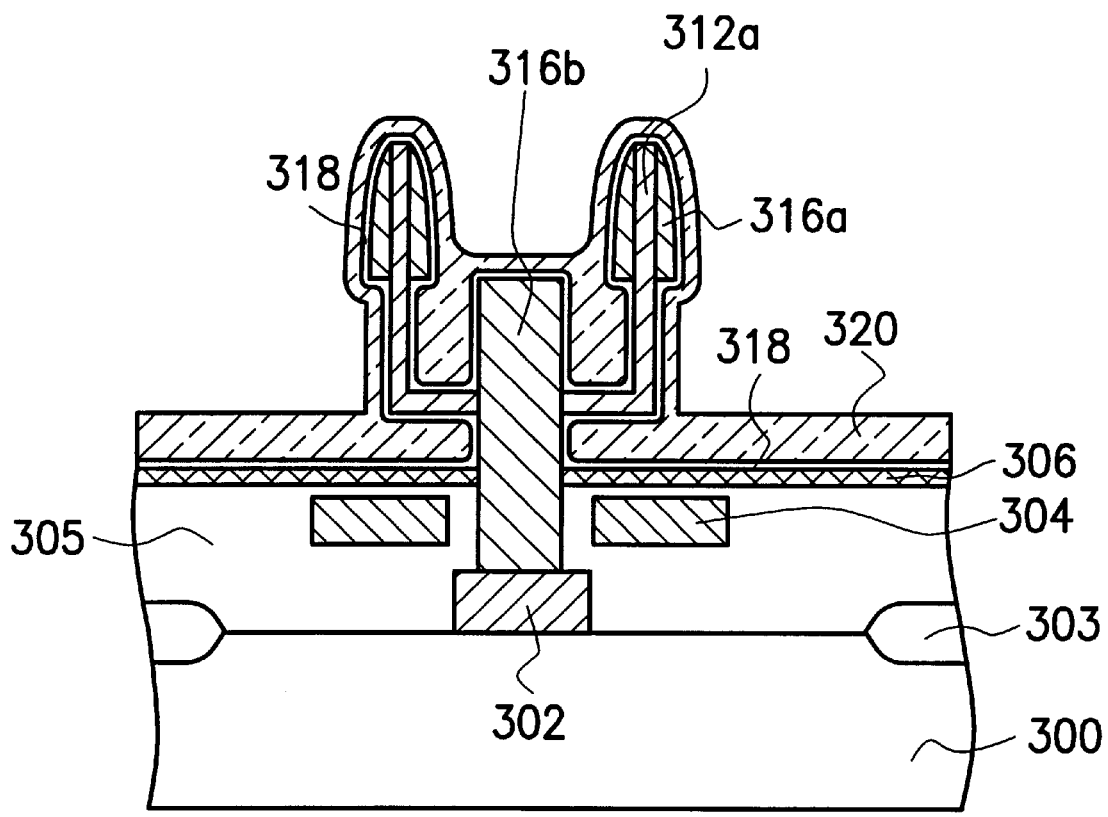
Figure 4G:
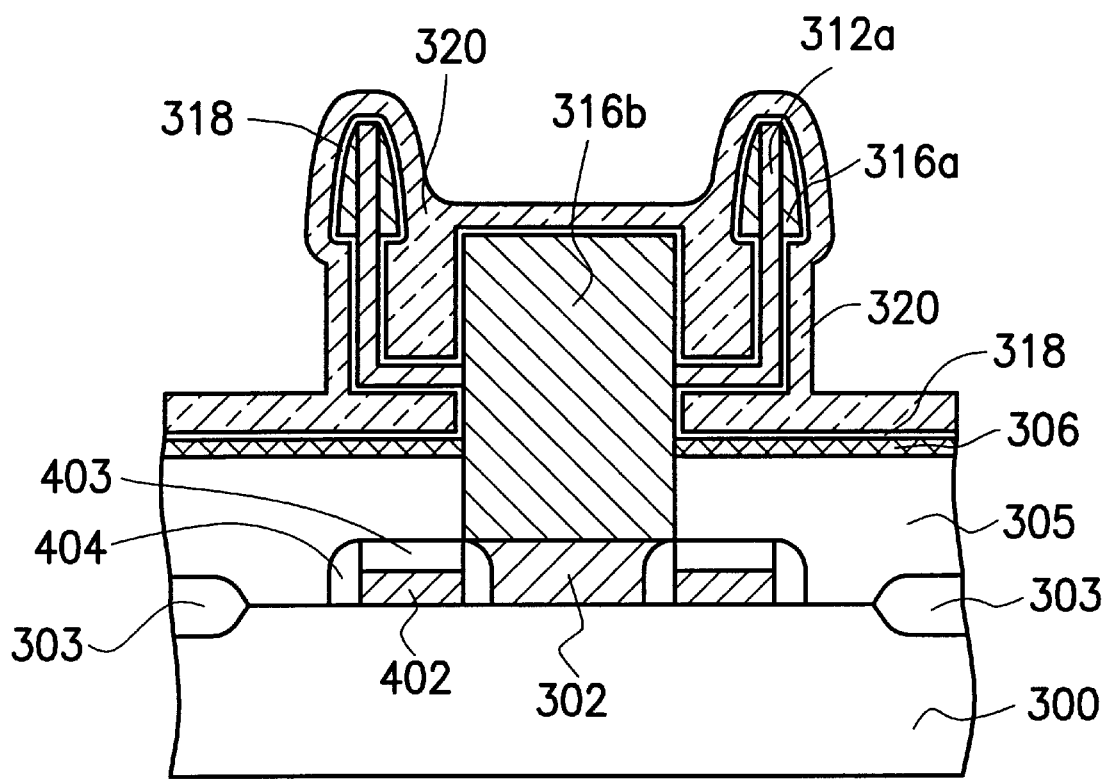

Thereafter, as shown in FIGS. 3G and 4G, a dielectric thin film 318 is formed over the lower electrode. Finally, a third conductive layer 320, acting as an upper electrode, is formed over the dielectric thin film 318, thereby completing the fabrication of a cylindrical shaped DRAM capacitor. The dielectric thin film 318 preferably having a thickness of about 50 Å can be an oxide/nitride/oxide (ONO) composite layer, a nitride/oxide (NO) composite layer, or a tantalum pentoxide ($Ta_2O_5$). The third conductive layer 320 can be a polysilicon layer.

In summary, major aspects of this invention include forming second dielectric spacers, and then using the spacers as an etching mask. Therefore, a simpler self-aligned etching operation instead of a photolithographic operation needs to be carried out. Moreover, the first conductive layer and the second conductive layer together create a lower electrode structure having a greater electrode area.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing cylindrical shaped capacitor, comprising the steps of:

providing a substrate having at least a polysilicon plug;

forming an insulation layer over the substrate;

forming a patterned first dielectric layer over the insulation layer, wherein the first dielectric layer further includes an opening;

forming a first conductive layer and then a second dielectric layer over the first dielectric layer;

removing a portion of the second dielectric layer and the first conductive layer to expose the first dielectric layer, thereby forming spacers on the sidewalls of the opening;

removing a portion of the first dielectric layer, the insulation layer and the substrate from the opening guided by the spacers until the polysilicon plug is exposed, at the same time removing a portion of the spacers to expose the remaining portion of the first conductive layer;

forming a second conductive layer over the entire substrate;

removing a portion of the second conductive layer so that only a portion of the second conductive layer remains on the sidewalls of the first conductive layer, and the first conductive layer and the second conductive layer together forming a lower electrode;

forming a dielectric film over the lower electrode; and forming a third conductive layer over the dielectric film.

2. The method of claim 1, wherein the step of forming the insulation layer includes depositing silicon nitride to form a silicon nitride layer.

3. The method of claim 1, wherein the step of forming the insulation layer includes depositing silicon oxy-nitride to form a silicon oxy-nitride layer.

4. The method of claim 1, wherein the step of forming the first and the second dielectric layer includes depositing silicon dioxide to form a first and a second silicon dioxide layer.

5. The method of claim 1, wherein the step of forming the first, the second and the third conductive layer includes depositing polysilicon to form a first, a second and a third polysilicon layer.

6. The method of claim 1, wherein the step of removing a portion of the second dielectric layer and the first conductive layer to expose the first dielectric layer and forming spacers on the sidewalls of the opening includes using an etching back method.

7. The method of claim 1, wherein the substrate at least includes a polysilicon plug and a word line.

8. The method of claim 7, wherein the substrate further includes a bit line.

* * * * *